United States Patent
Gu et al.

(10) Patent No.: US 6,472,914 B2
(45) Date of Patent: Oct. 29, 2002

(54) PROCESS INDEPENDENT ULTRALOW CHARGE PUMP

(75) Inventors: Richard X. W. Gu, Dallas, TX (US); James M. Tran, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/759,611

(22) Filed: Jan. 12, 2001

(65) Prior Publication Data

US 2001/0052806 A1 Dec. 20, 2001

Related U.S. Application Data

(60) Provisional application No. 60/177,442, filed on Jan. 21, 2000.

(51) Int. Cl.[7] ................................. H03L 7/06
(52) U.S. Cl. .................................... 327/157
(58) Field of Search .................. 327/156, 157, 327/158, 159

(56) References Cited

U.S. PATENT DOCUMENTS

| | | | |
|---|---|---|---|
| 5,532,636 A | 7/1996 | Mar et al. | 327/543 |
| 6,111,469 A | 8/2000 | Adachi | 331/17 |
| 6,160,432 A | 12/2000 | Rhee et al. | 327/157 |
| 6,222,421 B1 | 4/2001 | Kiyose | 331/17 |
| 6,316,977 B1 | 11/2001 | Sargeant | 327/157 |

OTHER PUBLICATIONS

Christian D. Hedayat et al., High–Level Modeling Applied to the Second–Order Charge–Pump PLL Circuit,Engineering Technology, Mar.–Apr. 1997, p. 99–107.

John G. Maneatis, Low–Jitter Process Independent DLL and PLL Based on Self–Biased Techniques, IEEE Journal of Solid–State Circuits, vol. NO. 11, Nov. 1996 p.1723–1732.

*Primary Examiner*—Jeffrey Zweizig
(74) *Attorney, Agent, or Firm*—April M. Mosby; W. James Brady; Frederick J. Telecky, Jr.

(57) ABSTRACT

The charge pump, having increased precision over known charge pumps, for a self-biasing phase-locked loop and a self-biasing delay-locked loop is disclosed herein. It includes a p-type charge pump and a n-type charge pump. The charge pump has inputs for an up and a down voltage output from a phase and frequency detector and for at least two bias voltage outputs from a bias generator. The p-type charge pump is coupled to the up output of the phase and frequency detector and a first bias voltage output from the bias generator circuit. The n-type charge pump is coupled to the p-type charge pump and has inputs coupled to the down output of the phase and frequency detector and a second bias voltage output from the bias generator circuit. A first capacitor is coupled across the p-type charge pump. This charge pump operates between $1\,\mu A$ to $10\,\mu A$. It is a more balanced design than known charge pump designs. Although PMOS is very slow, the present implementation of both the p-type and the n-type charge pumps pull up and pull down at the same time. This charge pump can be used with very narrow bandwidths. As another advantage, due to the up voltage output of the phase and frequency detector increasing at a rate approximate to current down voltage output, a relatively small amount of phase noise exists. With reference to phase error correction, this charge pump implementation more finely tunes the output signal of the phase locked loop design.

3 Claims, 3 Drawing Sheets

PROCESS INDEPENDENT ULTRALOW CHARGE PUMP

This application claims priority of provisional application No. 60/177,442, file Jan. 21, 2000.

FIELD OF THE INVENTION

This invention relates generally to the field of charge pump phase-locked loop circuitry; and, in particular, to process independent ultralow charge pump used in phase locked loop (PLL) for phase error correction.

BACKGROUND OF THE INVENTION

The charge-pump phase-locked loop (CP-PLL) is widely used in modern fully integrated circuits and is implemented in various applications; e.g. modulation, demodulation, detection, clock recovery, synchronization or frequency synthesis. Specifically, CP-PLLs are used in high speed transmitters and receivers operating at 2.5 Gb/sec used for Ethernet and high speed switching, switch network and fiber channels. The demand for a fast data switching and less input/output pins on a chip has created a need for a charge pump that can operate given these conditions.

The CP-PLL is a phase servo-system whose basic high level components include a phase and frequency detector, a charge-pump, a loop filter and a voltage controlled oscillator (VCO). The phase and frequency detector is purely a digital device having up and down voltage outputs. The charge pump, connected to the phase and frequency detector, delivers a pump current which is driven by the up and down voltage outputs of the phase and frequency detector. The loop filter, coupled to the charge pump, is generally a low-pass filter for converting the pump current into an analog voltage which is used to control the digital output of the voltage controlled oscillator. In essence, the charge pump provides the tuning voltage for the voltage controlled oscillator to generate a very stable, low noise local oscillator signal. A good overview of charge-pump PLL circuits is given in "High-Level Modeling applied to the Second-Order Charge-Pump PLL Circuit," by Hedayat et. al., TI Technical Journal, p.99–107, March–April 1997. The disclosure of the foregoing reference is incorporated herein.

A phase-locked loop design based upon a self-biased technique achieves process technology independence, fixed damping factor, fixed bandwidth to operating frequency ratio, broad frequency range, input phase offset cancellation and most importantly, low input tracking jitter. The key idea behind self-biasing is that it allows circuits to choose the operating bias levels in which they function best. A good overview of the theory of low-jitter process-independent phase-locked loop designs is given in "Low-Jitter Process-Independent DLL and PLL based on Self-Biased Techniques," by John G. Maneatis, IEEE Journal of Solid-State Circuits, Vol. No. 11, November, 1996. The disclosure of the foregoing reference is incorporated herein.

The self-biased design phase-locked loop and delay-locked loop both require a charge pump current that will vary several decades over the operating frequency range. The self-bias design includes a bias generator coupled between the charge pump and the VCO. Self-biasing makes it possible to design a charge pump that has zero static phase offset when both the up and down voltage outputs of the phase and frequency detector are asserted for equal duration on every cycle with in-phase inputs.

The known charge pump disclosed in the aforementioned reference is composed of two NMOS source coupled pairs each with a separate current source and connected by a current mirror made from symmetric load elements. Charge will be transferred from or to the loop filter connected to the output of the charge pump when the up and down voltage outputs, respectively, are switched high.

With both the up and down outputs asserted, the left source-coupled pair will behave like a half-buffer replica such as the one included in the known bias generator. The left source-coupled pair will produce the control voltage $V_{CTRL}$ at the current mirror node. The PMOS device in the right source coupled pair will have the control voltage $V_{CTRL}$ coupled at its gate and drain which is connected to the loop filter. This device will then source the exact same buffer bias current that is sunk by the remainder of the source coupled pair. With no net charge transferred to the loop filter, the charge pump will have zero static phase offset.

Given the relationship of the up and down charge pump output currents integrated over time, the area under both voltage output curves is equivalent. The slope with respect to amplitude, however, is not the same for both voltage output curves. Accordingly, a substantial amount of phase noise exists, since the up voltage output increases at a faster rate than the down voltage output.

In addition, the range of operation that exists for this known charge pump is between 0.1 mA to 1 mA. Thus, this charge pump roughly tunes the signal. There exists a need for a charge pump that tracks performance variation and more finely tunes the phase-locked loop. In addition, there is a need for a noise-free charge pump that tracks and recovers data from a GHz data stream.

SUMMARY OF THE INVENTION

A charge pump, having increased precision over known charge pumps, for a self-biasing phase-locked loop and a self-biasing delay-locked loop includes a p-type charge pump and a n-type charge pump. The charge pump has inputs for an up and a down voltage output from a phase and frequency detector and for at least two bias voltage outputs from a bias generator. The p-type charge pump is coupled to the up output of the phase and frequency detector and a first bias voltage output from the bias generator circuit. The n-type charge pump is coupled to the p-type charge pump and has inputs coupled to the down output of the phase and frequency detector and a second bias voltage output from the bias generator circuit. A first capacitor is coupled across the p-type charge pump. This charge pump operates between 1 $\mu$A to 10 $\mu$A. It is a more balanced design than known charge pump designs. Although PMOS is slow, the present implementation of both the p-type and the n-type charge pumps pull up and pull down at the same time. This charge pump can be used with very narrow bandwidths. As another advantage, due to the up voltage output of the phase and frequency detector increasing at a rate approximate to current down voltage output, a relatively small amount of phase noise exists. With reference to phase error correction, this charge pump implementation more finely tunes the output signal of the phase locked loop design.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
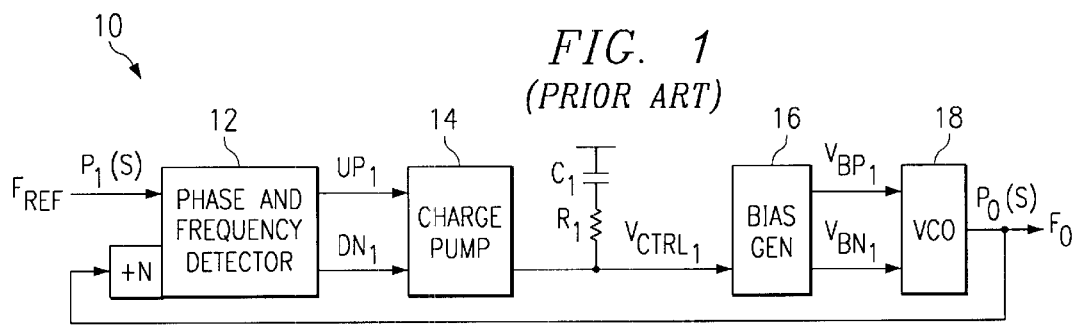
FIG. 1 is a schematic of a known charge-pump phase-locked loop design.

The present invention is best understood by comparison with the prior art. Hence, this detailed description begins with a discussion of a well-known charge-pump phase-locked loop having self biasing as disclosed in "Low-Jitter Process-Independent DLL and PLL based on Self-Biased Techniques," by John G. Maneatis, IEEE Journal of Solid-State Circuits, Vol. No. 11, November, 1996. As shown in FIG. 1, an input signal $P_2$ (s) is received by a phase and frequency detector 12. The phase and frequency detector 12 is purely a digital device having up $UP_1$ and down $DN_1$ voltage outputs, A charge pump 14, connected to the phase and frequency detector 12, delivers a charge pump current which is driven by the up $UP_1$ and down $DN_1$ voltage outputs of the phase and frequency detector 12. The loop filter including a capacitor $C_1$ and a resistor $R_1$ is coupled to the charge pump 14 for converting the pump current into an analog voltage $V_{CTRL1}$ which is used to indirectly control the digital output $P_O$(s) of the voltage controlled oscillator 18. The loop filter is coupled to the bias generator 16. In essence, the charge pump 14 provides the tuning voltage for the voltage controlled oscillator 18 to generate a very stable, low noise local oscillator signal.

The bias generator 16 produces the bias voltages $V_{BN1}$ and $V_{BP1}$ from the control voltage $V_{CTRL1}$ generated by the charge pump. Its primary function is to continuously adjust a buffer bias current in order to provide the correct lower swing limit $V_{CTRL1}$ for its buffer stages (not shown). In so doing, it establishes a current that is held constant and independent of supply voltage. The bias generator also provides a buffered version of control voltage $V_{CTRL1}$ at the output which supplies the bias voltage $V_{BP1}$ using an additional half-buffer replica. This output isolates control voltage $V_{CTRL1}$ from potential capacitive coupling in buffer stages included with the bias generator and plays an important role in the self-biased PLL design. There are a variety of self-biasing techniques that provide further reduction in input tracking jitter by allowing the loop bandwidth to be set as close as possible to the operating frequency.

Figure 2:
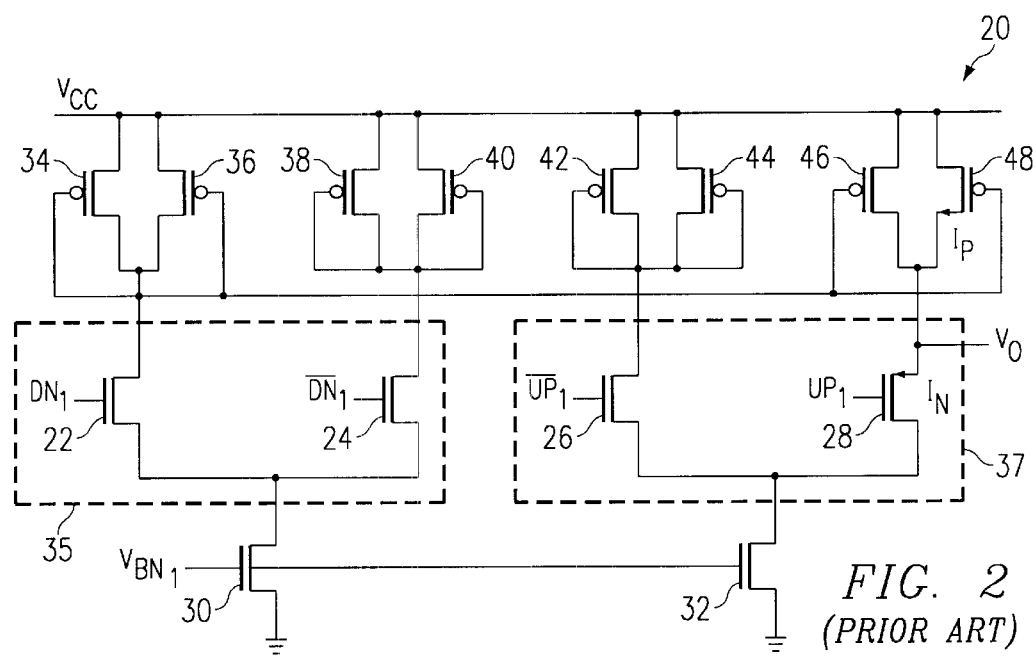
FIG. 2 is a schematic of a known charge pump.

FIG. 2 discloses a known charge pump included within the design of the charge-pump phased-lock loop implementation of FIG. 1 as disclosed in "Low-Jitter Process-Independent DLL and PLL based on Self-Biased Techniques," by John G. Maneatis, IEEE Journal of Solid-State Circuits, Vol. No. 11, November, 1996. The charge pump 20 is composed of two NMOS source coupled pairs, a left pair 35 including transistors 22 and 24 and a right pair 37 including transistors 26 and 28. Each pair 35 and 37 has a separate current source, a left current source includes transistor 30 and a right current source includes transistor 32. Each pair 35 and 37 are connected by a current mirror made from symmetric load elements 34, 36, 38, 40, 42, 44, 46, and 48. Charge will be transferred from or to the loop filter connected to the output $V_o$ when the up $UP_1$ and down $DN_1$ voltage outputs, respectively, are switched high. The design is implemented such that if the source coupled pair outputs 37 are unselected, they are connected to symmetric load elements 42, 44, 46 and 48 to match the voltages at the other outputs 34, 86, 38, and 40 This is true whether the unselected source coupled pair is the left or right pair, 35 or 37.

Figure 3:
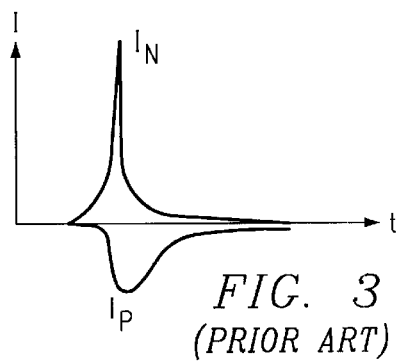
FIG. 3 is a graph of the p-channel and n-channel charge pump currents with respect to time for the known charge pump of FIG. 2.

FIG. 3 illustrates the graph of the p-channel and n-channel charge pump currents $I_P$ and $I_N$ with respect to time. Given the relationship of the up $UP_1$ and down $DN_1$ voltage outputs integrated over time, the area under both voltage output curves is equivalent The slope with respect to amplitude, however, is not the same for both voltage output curves. Accordingly, a substantial amount of phase noise exists, since the up voltage output increases at a faster rate than the down voltage output. In addition, the range of operation that exists for this known charge pump is between 0.1 mA to 1 mA. Thus, this charge pump roughly tunes the signal.

Figure 4:
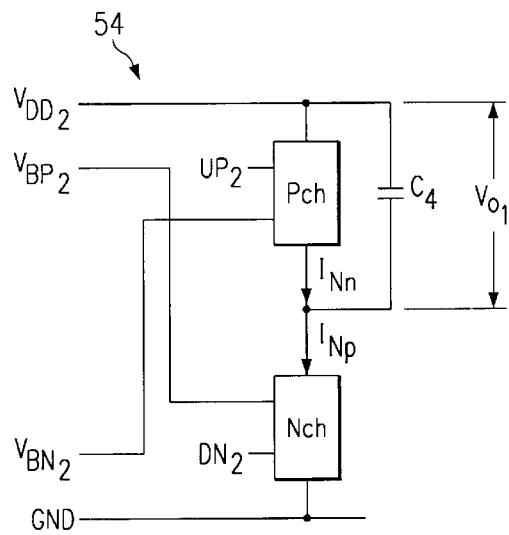
FIG. 4 is a block diagram of the charge pump in accordance with the present invention.

FIG. 4 illustrates a block diagram of a charge pump 54 in accordance with the present invention. The charge pump 54 includes a p-type charge pump $P_{CH}$ and an n-type charge pump $N_{CH}$. Bias voltages $V_{BP2}$ and $V_{DN2}$ are coupled to n-type charge pump $N_{CH}$ and the p-type charge pump $P_{CH}$, respectively. Capacitor $C_4$ couples across the p-type charge pump $P_{CH}$. The output voltage $V_o$ is the voltage across the capacitor $C_4$. This circuit is used in tracking and recovering data from a GHz data stream. This noise free charge pump provides an ultralow output current. The range of operation that exists for this charge pump is about 1–5$\mu$A. This charge pump tracks performance variation, keeping the bandwidth unchanged. In the case where the supply voltage is high or the temperature is low, the bias voltage $V_{BP2}$ increases while the bias voltage $V_{BN2}$ decreases. In the case where the supply voltage is low or the temperature is high, bias voltage $V_{BP2}$ decreases and $V_{BN2}$ increases. Both bias voltages $V_{BP2}$ and $V_{BN2}$ are used as process control voltages sources to design an ultralow charge pump that is process independent.

Figure 5:
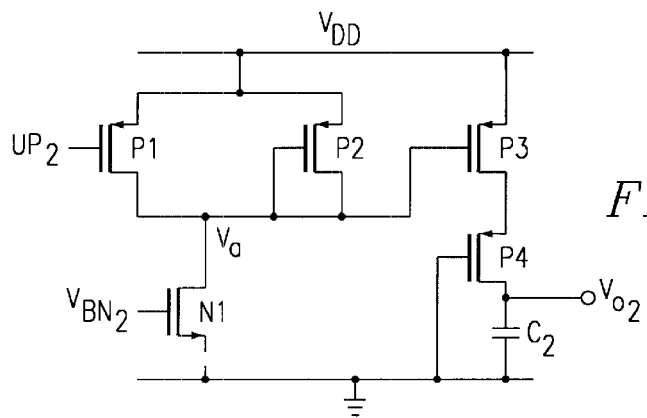
FIG. 5 is a schematic of a p-type charge pump in accordance with the present invention.
Figure 6:
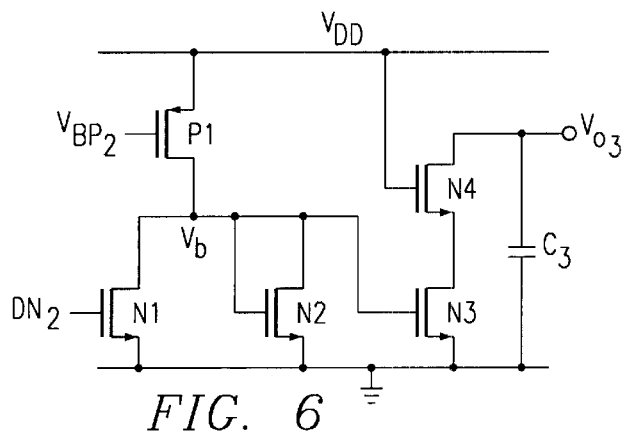
FIG. 6 is a schematic of a n-type charge pump in accordance with the present invention.

FIGS. 5 and 6 display the schematic of the p-type charge pump PCH 40 and the n-type charge pump NCH 50, respectively. As shown in FIG. 5, the up output $UP_2$ from a phase and frequency detector (not shown) couples to the gate of transistor P1. The source of both transistors P1 and P2 are coupled to the power supply rail VDD. The drain of both transistors P1 and P2 and the gate of transistor P2 couple to from node Va. Node Va couples to the drain of transistor N1. The voltage swing of voltage Va is quite small approximately about 0.5V which results in a quiescent current switch. Voltage $V_{BN2}$ couples to the gate of transistor N1, The source of transistor N1 couples to ground. Node Va couples to the gate of transistor P3. Power supply rail VDD couples to the source of transistor P3. The drain of transistor P3 couples to the source of transistor P4. The gate of transistor P4 couples to ground The drain of transistor P4 couples across capacitor $C_2$ and ground. The output voltage $V_{O2}$ is the voltage applied across capacitor $C_2$.

As shown in FIG. 6, the down output $DN_2$ from a phase and frequency detector (not shown) couples to the gate of transistor N1. voltage $V_{BP2}$ couples to the gate of transistor p1. The drain of transistor P1 and the drain of both transistors N1 and N2 along with the gate of transistor N2 all couple to form node Vb. Node Vb couples to the gate of transistor N3. Voltage Vb swings is about 0.5V at a 2.5V supply voltage. The output current is about 1 $\mu$A to 5 $\mu$A without switching noise. The source of transistors N1, N2 and N3 each couple to ground. The source of transistor p1 couples to the power supply rail VDD. Power supply rail VDD couples to the gate of transistor N4. The source of transistor N4 couples to the drain of transistor N3. The source of transistor N3 couples to ground. The drain of transistor N4 couples across capacitor $C_3$ and ground. The output voltage $V_{O3}$ is the voltage applied across capacitor $C_3$.

In operation, when the phase shift detector detects a backwards shift in phase of the output signal both currents at $UP_2$ and $DN_2$ increase to $V_{DD}$. When the up voltage output $UP_2$ increases to $V_{DD}$, the p-type charge pump of FIG. 5 turns on. Initially transistors $P_1$, $P_2$, and $P_4$ of the P-type charge pump in FIG. 5 are on. Also, initially the voltage at node $v_a$ must be set such that it is less than the threshold voltage of transistor $P_3$. As the up voltage output $UP_2$ increases, transistor $P_1$ turns off and as a result the voltage at node $V_a$ increases above the threshold voltage of transistor $P_3$, turning transistor $P_3$ on. Current from $V_{BN2}$ charges capacitor $C_2$ and moves the VCO faster; thus corrects the phase shift error.

When the phase shifts forwards, both up and down voltages, $UP_2$ and $DN_2$, decrease to 0. As a result of the up voltage output $UP_2$ decreasing to 0, the N-type charge pump of FIG. 6 turns on. Initially transistors $N_1$, $N_2$, and $N_4$ are on. Also, initially the voltage at node $V_b$ is set such that it is less than the threshold voltage of transistor $N_3$. As the down voltage output $DN_2$ decreases, transistor $N_1$ turns off and as a result the voltage at node $V_b$ increases above the threshold voltage of transistor $N_3$, turning transistor $N_3$ on. Current from $V_{BP2}$ discharges capacitor $C_3$ and moves the VCO slower and, thus, corrects the phase shift error.

Figure 7:
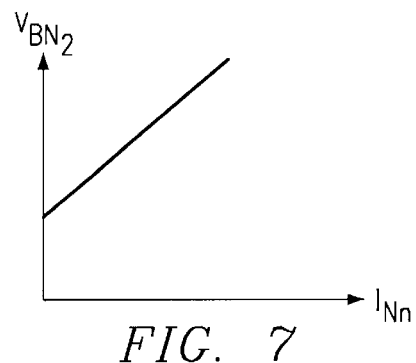
FIG. 7 is a graph of the bias voltage Vase with respect to current.
Figure 8:
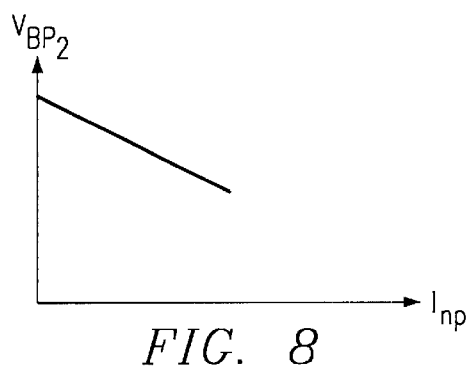
FIG. 8 is a graph of the bias voltage $V_{BN2}$ with respect to current.

When there is no error in phase, up voltage output $UP_2$ is 0 and down voltage output $DN_2$ is $V_{DD}$. Accordingly, since there is no need for phase error correction, both the p-type and the n-type charge pumps of FIGS. 5 and 6 are off. The logic prohibits up voltage output $UP_2$ from going to $V_{DD}$ at the same time that the down voltage output $DN_2$ goes to FIG. 7 and 8 disclose the relationship of voltages $V_{BN2}$ and $V_{BP2}$ with respect to charge pump currents, $I_{Nn}$ and $I_{NP}$. As illustrated, when voltage $V_{BN2}$ increases, the current $I_{Nn}$ increases and when voltage $V_{BN2}$ decreases, the current $I_{NP}$ increases. As voltage $V_{BN2}$ goes high, the objective is to output more current When voltage $V_{BN2}$ increases, voltage $V_{BP}$ decreases.

Figure 9:
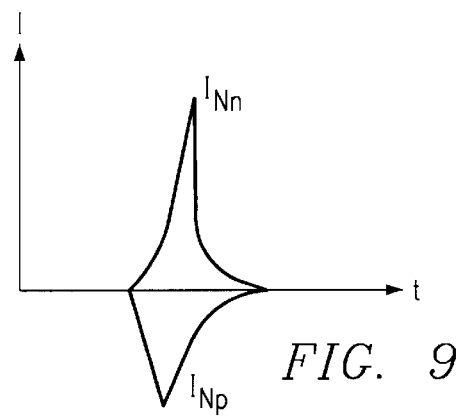
FIG. 9 is a graph of the p-channel and n-channel charge pump currents with respect to time for the charge pump in accordance with the present invention.

The charge pump of the present invention operates at 1 $\mu A$ to 10 $\mu A$. FIG. 9 discloses the relationship of the charge pump currents, $I_{Nn}$ and $I_{NP}$, integrated over time. The area under the curve is the same and the slope with respect to amplitude is approximately equivalent. Thus, since current $I_{Nn}$ increases at a rate approximate to current $I_{NP}$, a relatively small amount of phase noise exists.

Figure 10:
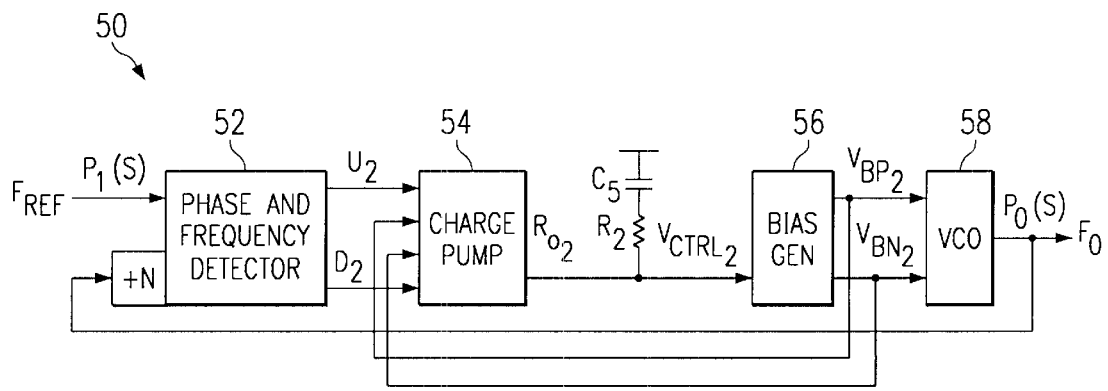
FIG. 10 is the schematic of the charge-pump phase-locked loop design in accordance with the present invention.
Figure 11:
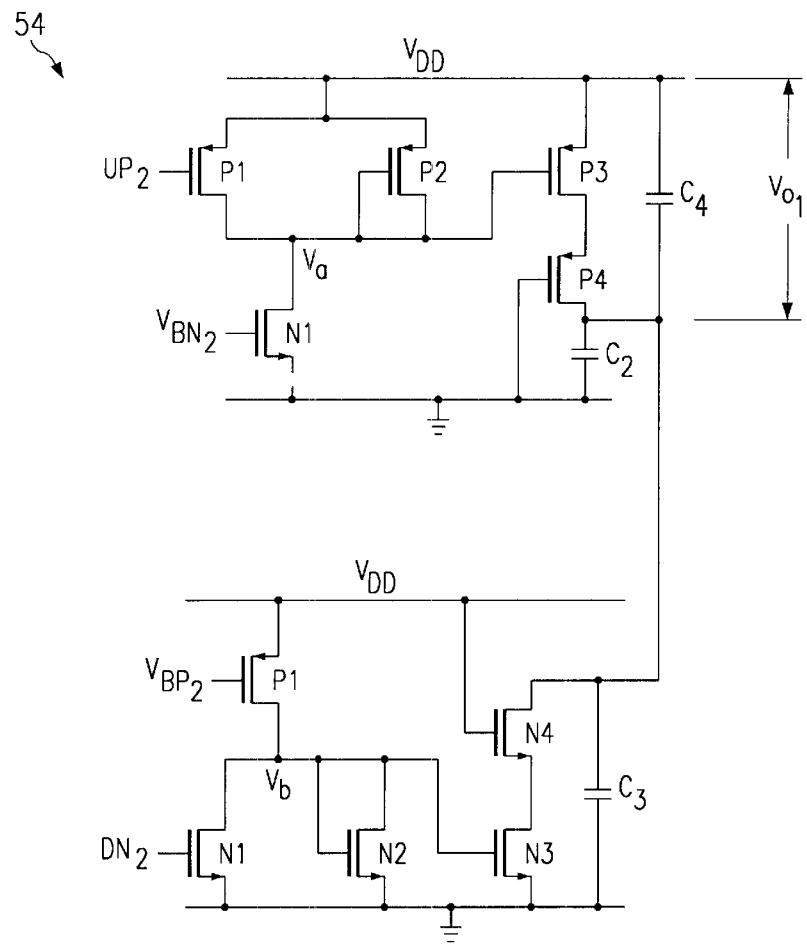
FIG. 11 is the schematic of the charge pump of FIG. 4.

FIG. 10 represents the block diagram of the charge-pump phase-locked loop design 50 in accordance with the present invention including phase and frequency detector 52, charge pump 54, low pass filter including capacitor $C_5$, and $R_2$, bias generator 56 and VCO 58. FIG. 11 represents the detailed schematic of charge pump 54, combining FIGS. 4, 5, and 6.

Those skilled in the art to which the invention relates will appreciate that various substitutions, modifications and additions can be made to the described embodiments, without departing from the spirit and scope of the invention as defined by the claims.

What is claimed is:

1. A charge pump for a self-biasing phase-locked loop and a self-biasing delay-locked loop, the charge pump having an output, a pair of inputs for an up and a down output from a phase and frequency detector and a pair of inputs for at least two bias voltage outputs from a bias generator, comprising;

a p-type charge pump coupled to the up output of the phase and frequency detector and a first bias voltage output from the bias generator circuit;

a n-type charge pump coupled to the p-type charge pump, the n-type charge pump having inputs coupled to the down output of the phase and frequency detector and a second bias voltage output from the bias generator circuit, the bias generator circuit is coupled to the output of the charge pump and coupled to provide feedback to the charge pump; and a first capacitor coupled across the p-type charge pump, the voltage across the first capacitor provides the output for the charge pump.

2. The charge pump as claimed in claim 1 wherein the p-type charge pump having a power supply and a ground comprises:

a first p-type transistor having a gate, a source, and a drain, the gate coupled to the up output of the phase and frequency detector, the source coupled to the power supply;

a second p-type transistor having a gate, a source, and a drain, the source coupled to the power supply, the gate and drain coupled to the drain of the first p-type transistor to form a voltage reference node;

a first n-type transistor having a gate, a source and a drain, the drain coupled to the voltage reference node, the gate coupled to the first bias voltage outputs of the bias generator, the source coupled to ground;

a third p-type transistor having a gate, a source and a drain, the source coupled to the power supply, the gate coupled to the voltage reference node;

a fourth p-type transistor having a gate, a source and a drain, the source coupled to the drain of the third p-type transistor, the gate coupled to ground; and a second capacitor coupled between the drain of the fourth p-type transistor and ground.

3. The charge pump as claimed in claim 1 wherein the n-type charge pump having a power supply and a ground comprises:

a first p-type transistor having a gate, a source, and a drain, the gate coupled to the second bias voltage output of the bias generator, the source coupled to the power supply, the drain forms a voltage reference node;

a first n-type transistor having a gate, a source and a drain, the drain coupled to the voltage reference node, the gate coupled to the down output of the phase and frequency detector, the source coupled to ground;

a second n-type transistor having a gate, a source and a drain, the drain and the gate coupled to the voltage reference node, the source coupled to ground;

a third n-type transistor having a gate, a source and a drain, the gate coupled to the voltage reference node, the source coupled to ground;

a fourth n-type transistor having a gate, a source and a drain, the source coupled to the drain of the third n-type transistor, the gate coupled to the power supply; and a second capacitor coupled between the drain of the fourth n-type transistor and ground.

* * * * *